(12) United States Patent
Matsuo et al.

(10) Patent No.: US 11,784,167 B2
(45) Date of Patent: Oct. 10, 2023

(54) SEMICONDUCTOR DEVICE WITH METAL FILM HAVING OPENINGS

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Kazuki Matsuo, Nonoichi (JP); Shunsuke Nitta, Hakusan (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 38 days.

(21) Appl. No.: 17/653,932

(22) Filed: Mar. 8, 2022

(65) Prior Publication Data

US 2023/0092204 A1   Mar. 23, 2023

(30) Foreign Application Priority Data

Sep. 22, 2021   (JP) .................................. 2021-154483

(51) Int. Cl.
*H01L 25/065* (2023.01)
*H01L 23/00* (2006.01)

(52) U.S. Cl.
CPC .......... *H01L 25/0657* (2013.01); *H01L 24/13* (2013.01); *H01L 24/30* (2013.01)

(58) Field of Classification Search
CPC .................................................. H01L 25/0657
USPC ........................................................ 257/686
See application file for complete search history.

(56) References Cited

U.S. PATENT DOCUMENTS

2008/0272472 A1 * 11/2008 Hata ...................... H01L 24/11
257/E23.044
2020/0343106 A1    10/2020 Usui

FOREIGN PATENT DOCUMENTS

| JP | 2005-101293 A | 4/2005 |
| JP | 6111907 B2 | 4/2017 |
| JP | 6756407 B2 | 9/2020 |

* cited by examiner

*Primary Examiner* — Ajay Arora
(74) *Attorney, Agent, or Firm* — Allen & Overy LLP

(57) ABSTRACT

A semiconductor device includes: a die pad having a top surface; a semiconductor chip provided on the top surface; a first solder provided between the top surface and the semiconductor chip, the first solder bonding the top surface and the semiconductor chip; a first metal film provided on the semiconductor chip; a first insulating film provided on the first metal film and having a first opening; a connector having a first end and a second end, the first end being provided on the first metal film in the first opening; a second metal film provided in the first opening, the second metal film having a plurality of second openings provided so as to surround a portion of the first metal film in contact with the first end, and the second metal film being provided between the first end of the connector and the portion of the first metal film; a plurality of second insulating films provided in direct contact with the first metal film in each of the second openings; and a second solder provided between the second metal film and the first end to bond the first end and the second metal film to each other.

12 Claims, 13 Drawing Sheets

A-A'

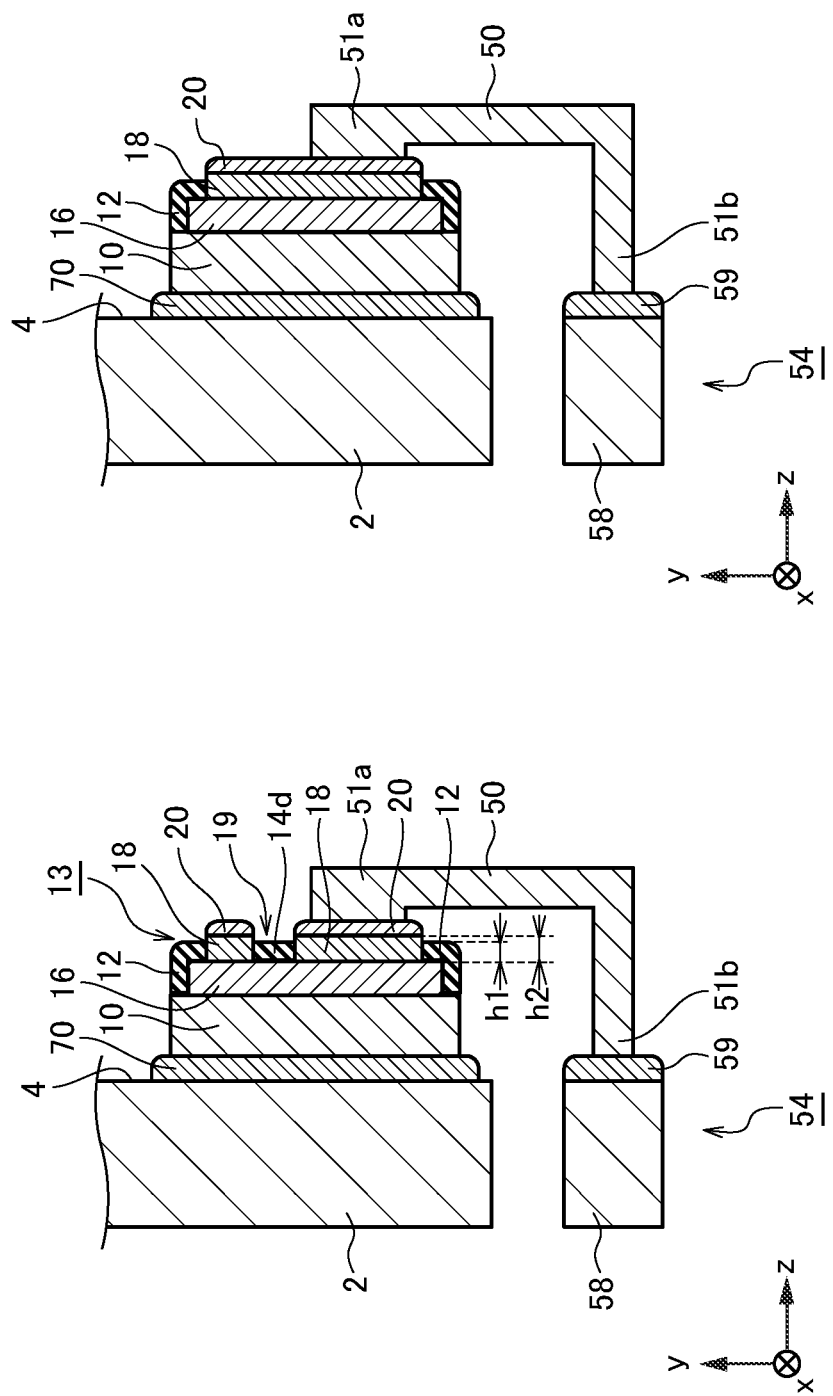

SEMICONDUCTOR DEVICE WITH METAL FILM HAVING OPENINGS

CROSS-REFERENCE TO RELATED APPLICATION

This application is based upon and claims the benefit of priority from Japanese Patent Application No. 2021-154483, filed on Sep. 22, 2021, the entire contents of which are incorporated herein by reference.

FIELD

Embodiments described herein relate generally to a semiconductor device.

BACKGROUND

A semiconductor device having a semiconductor chip, such as a metal oxide semiconductor field effect transistor (MOSFET), is used in applications such as power conversion. For example, when the semiconductor device is a vertical MOSFET, a source electrode provided on the top surface of the semiconductor chip is connected to, for example, a connector provided on the MOSFET.

BRIEF DESCRIPTION OF THE DRAWINGS

FIGS. 2A and 2B are schematic cross-sectional views of a main part of the semiconductor device of the first embodiment.

DETAILED DESCRIPTION

Figure 1:
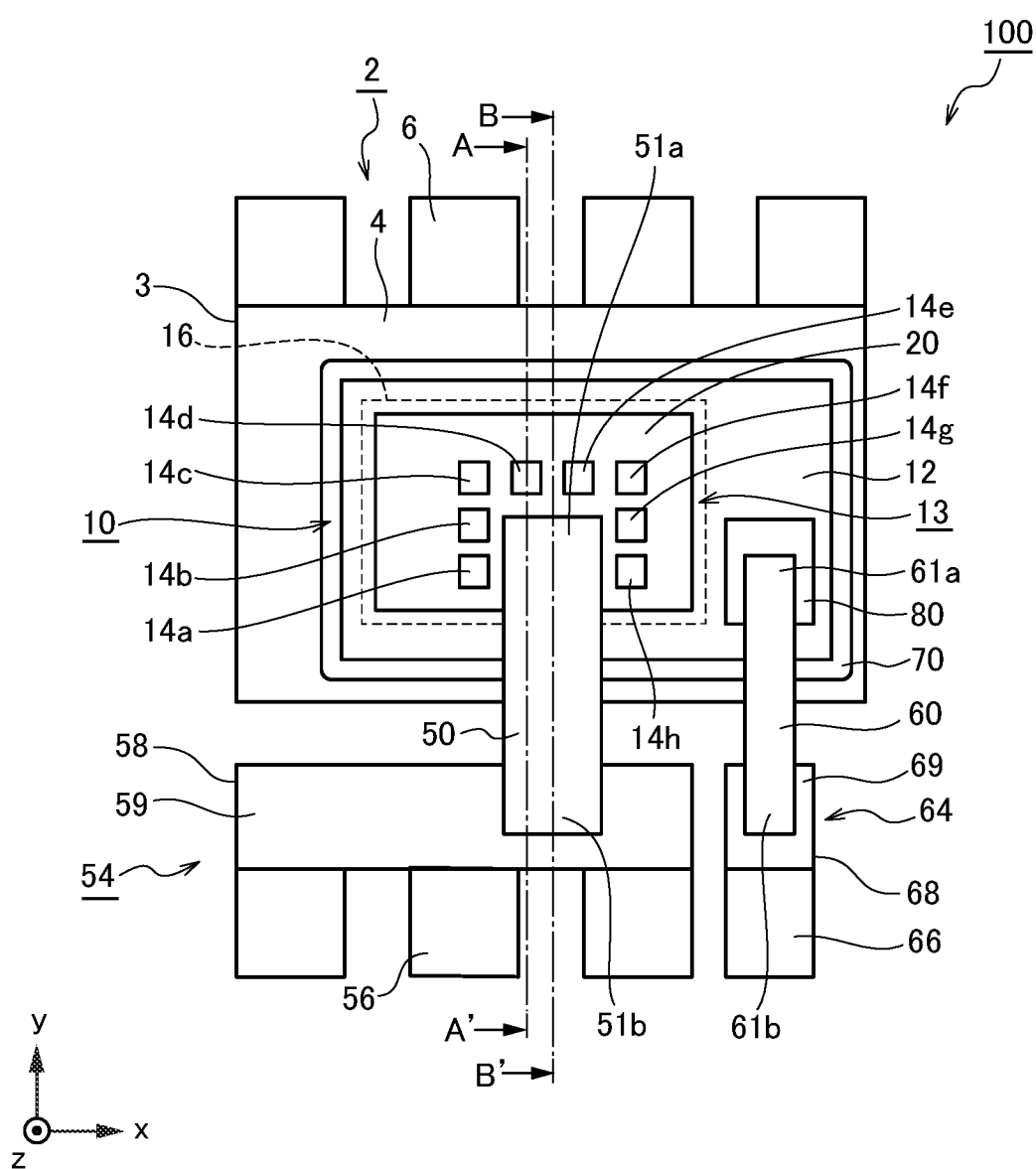
FIG. 1 is a schematic top view of a semiconductor device of a first embodiment.

A semiconductor device of embodiments includes: a die pad having a top surface; a semiconductor chip provided on the top surface; a first solder provided between the top surface and the semiconductor chip, the first solder bonding the top surface and the semiconductor chip; a first metal film provided on the semiconductor chip; a first insulating film provided on the first metal film and having a first opening; a connector having a first end and a second end, the first end being provided on the first metal film in the first opening; a second metal film provided in the first opening, the second metal film having a plurality of second openings provided so as to surround a portion of the first metal film in contact with the first end, and the second metal film being provided between the first end of the connector and the portion of the first metal film; a plurality of second insulating films provided in direct contact with the first metal film in each of the second openings; and a second solder provided between the second metal film and the first end to bond the first end and the second metal film to each other.

Hereinafter, embodiments will be described with reference to the diagrams. In the following description, the same members and the like are denoted by the same reference numerals, and the description of the members and the like once described will be omitted as appropriate.

In this specification, in order to show the positional relationship of components and the like, the upper direction of the diagram is described as "upper" and the lower direction of the diagram is described as "lower". In this specification, the concepts of "upper" and "lower" do not necessarily indicate the relationship with the direction of gravity.

First Embodiment

A semiconductor device of embodiments includes: a die pad having a top surface; a semiconductor chip provided on the top surface; a first solder provided between the top surface and the semiconductor chip to bond the top surface and the semiconductor chip to each other; a first metal film provided on the semiconductor chip; a first insulating film provided on the first metal film and having a first opening; a connector having a first end and a second end, the first end being provided on the first metal film in the first opening; a second metal film provided in the first opening, having a plurality of second openings provided so as to surround a portion of the first metal film in contact with the first end, and provided between the first end of the connector and the portion of the first metal film; a plurality of second insulating films provided in direct contact with the first metal film in each of the second openings; and a second solder provided between the second metal film and the first end to bond the first end and the second metal film to each other.

FIG. 1 is a schematic top view of a semiconductor device 100 of embodiments. FIGS. 2A and 2B are schematic cross-sectional views of a main part of the semiconductor device 100 of embodiments. FIG. 2A is a schematic diagram of an AA' cross section in FIG. 1. FIG. 2B is a schematic diagram of a BB' cross section in FIG. 1.

The semiconductor device 100 of embodiments will be described with reference to FIGS. 1, 2A, and 2B.

A die pad 2 is a member which contains a conductive material, such as Cu (copper), and on which a semiconductor chip 10 is disposed. The die pad 2 has a first bed portion 3 and a first outer lead 6. The first bed portion 3 has a top surface 4. The semiconductor chip 10 is provided on the top surface 4. The first outer lead 6 is connected to the first bed portion 3. The first outer lead 6 is used for connection between the semiconductor chip 10 and an external circuit (not shown).

Here, an X direction, a Y direction perpendicular to the X direction, and a Z direction perpendicular to the X and Y directions are defined. The top surface 4 is disposed in parallel to the XY plane. The Y direction is an example of the first direction. The X direction is an example of the second direction.

The semiconductor chip 10 is provided on the top surface 4 of the die pad 2. In the semiconductor chip 10, a vertical MOSFET, an insulated gate bipolar transistor (IGBT), or the like is provided on a semiconductor substrate formed of, for example, silicon (Si), silicon carbide (SiC), gallium arsenide (GaAs), or gallium nitride (GaN).

A first solder 70 is provided between the top surface 4 and the semiconductor chip 10. The first solder 70 bonds the top surface 4 and the semiconductor chip 10 to each other. For example, when a MOSFET is provided on the semiconductor chip 10, the first solder 70 bonds the drain electrode (not shown) of the semiconductor chip 10 and the top surface 4 to each other.

A first metal film 16 is provided on the semiconductor chip 10. For example, when a MOSFET is provided on the semiconductor chip 10, the first metal film 16 corresponds to the source electrode of the MOSFET. The first metal film 16 contains, for example, aluminum (Al).

A first insulating film 12 is provided on the first metal film 16. For example, the first insulating film 12 is provided on the end portion of the semiconductor chip 10 and on the end portion of the first metal film 16. The first insulating film 12 has a first opening 13. The first opening 13 penetrates the first insulating film 12. The first insulating film 12 contains an insulating material, such as polyimide.

A first post portion (an example of a post portion) 54 includes a second bed portion 58 and a second outer lead 56. The first post portion 54 contains a conductive material, such as Cu. The second outer lead 56 is used for connection between the semiconductor chip 10 and an external circuit (not shown).

A second post portion 64 includes a third bed portion 68 and a third outer lead 66. The second post portion 64 contains a conductive material, such as Cu. The third outer lead 66 is used for connection between the semiconductor chip 10 and an external circuit (not shown).

A first connector (an example of a connector) 50 has a first end 51a and a second end 51b. The first connector 50 contains a conductive material, such as Cu. The surface of the first connector 50 may be plated with, for example, a material containing Sn. The first end 51a is provided on the first metal film 16 in the first opening 13. The second end 51b is provided on the second bed portion 58. The first connector 50 is provided so as to extend in the Y direction stretching between the die pad 2 and the first post portion 54 to which the second end 51b is connected.

A second metal film 18 is provided between the first end 51a of the first connector 50 and the first metal film 16 in the first opening 13. The second metal film 18 has a plurality of second openings 19. The plurality of second openings 19 are provided so as to surround a portion of the first metal film 16 in contact with the first end 51a. The second metal film 18 contains, for example, nickel (Ni) and gold (Au). The second metal film 18 is provided, for example, to increase the bonding strength between a second solder 20 and the first metal film 16.

A plurality of second insulating films 14 are provided in direct contact with the first metal film 16 in each of the plurality of second openings 19. In FIG. 1, a second insulating film 14a, a second insulating film 14b, a second insulating film 14c, a second insulating film 14d, a second insulating film 14e, a second insulating film 14f, a second insulating film 14g, and a second insulating film 14h are shown. The second insulating film 14a, the second insulating film 14b, the second insulating film 14c, the second insulating film 14d, the second insulating film 14e, the second insulating film 14f, the second insulating film 14g, and the second insulating film 14h are provided in direct contact with the first metal film 16 in each of the second openings 19. The plurality of second insulating films 14 are provided so as to surround the first end 51a.

In FIG. 1, the shapes of the plurality of second insulating films 14 in a plane parallel to the top surface 4 are rectangular. However, the shapes of the plurality of second insulating films 14 in the plane parallel to the top surface 4 are not particularly limited.

The height $h_2$ of the second metal film 18 in a direction perpendicular to the top surface 4 is preferably larger than the height $h_1$ of each of the plurality of second insulating films 14 in the direction perpendicular to the top surface 4. In addition, the height of the first insulating film 12 on the first metal film 16 in the direction perpendicular to the top surface 4 and the height of each of the plurality of second insulating films 14 on the first metal film 16 in the direction perpendicular to the top surface 4 are $h_1$ and are preferably equal to each other (FIG. 2A).

The second solder 20 is provided on the second metal film 18. The second solder 20 is provided between the second metal film 18 and the first end 51a. The second solder 20 bonds the first end 51a and the second metal film 18 to each other.

A third solder 59 is provided between the second bed portion 58 and the second end 51b. The third solder 59 bonds the second bed portion 58 and the second end 51b to each other.

A second connector 60 has a third end portion 61a and a fourth end portion 61b. The second connector 60 contains a conductive material, such as Cu. The surface of the second connector 60 may be plated with, for example, a material containing Sn. The third end portion 61a is electrically connected to the semiconductor chip 10 via a fourth solder 80 provided on the semiconductor chip 10. Below the fourth solder 80, for example, a gate electrode (not shown) of the semiconductor chip 10 is provided.

The first connector 50 and the second connector 60 are hard connectors that cannot be easily bent, and are different from wires used for bonding.

A fifth solder 69 is provided between the third bed portion 68 and the fourth end portion 61b. The fifth solder 69 bonds the third bed portion 68 and the fourth end portion 61b to each other.

As the first solder 70, the second solder 20, the third solder 59, the fourth solder 80, and the fifth solder 69, for example, solder containing lead (Pb) and tin (Sn), solder containing Pb, silver (Ag), and Sn, solder containing Sn and antimony (Sb), solder containing gold (Au) and Sn, solder containing Au and Si, and solder containing Au and germanium (Ge) can be preferably used.

The thickness of the first metal film 16 is, for example, about 4 μm. The thickness of the second metal film 18 is, for example, about 3 μm. The thickness of the first insulating film 12 is, for example, 4 μm or more and 10 μm or less. The thickness of the second insulating film 14 is, for example, 4 μm or more and 10 μm or less.

Figure 3B:
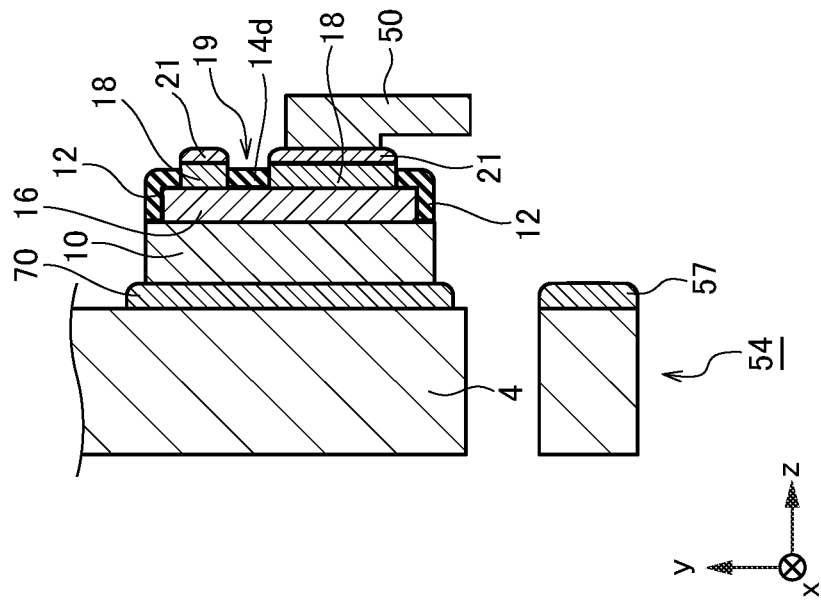
FIGS. 3A and 3B are schematic diagrams showing a part of a process of manufacturing the semiconductor device of the first embodiment.
Figure 3A:
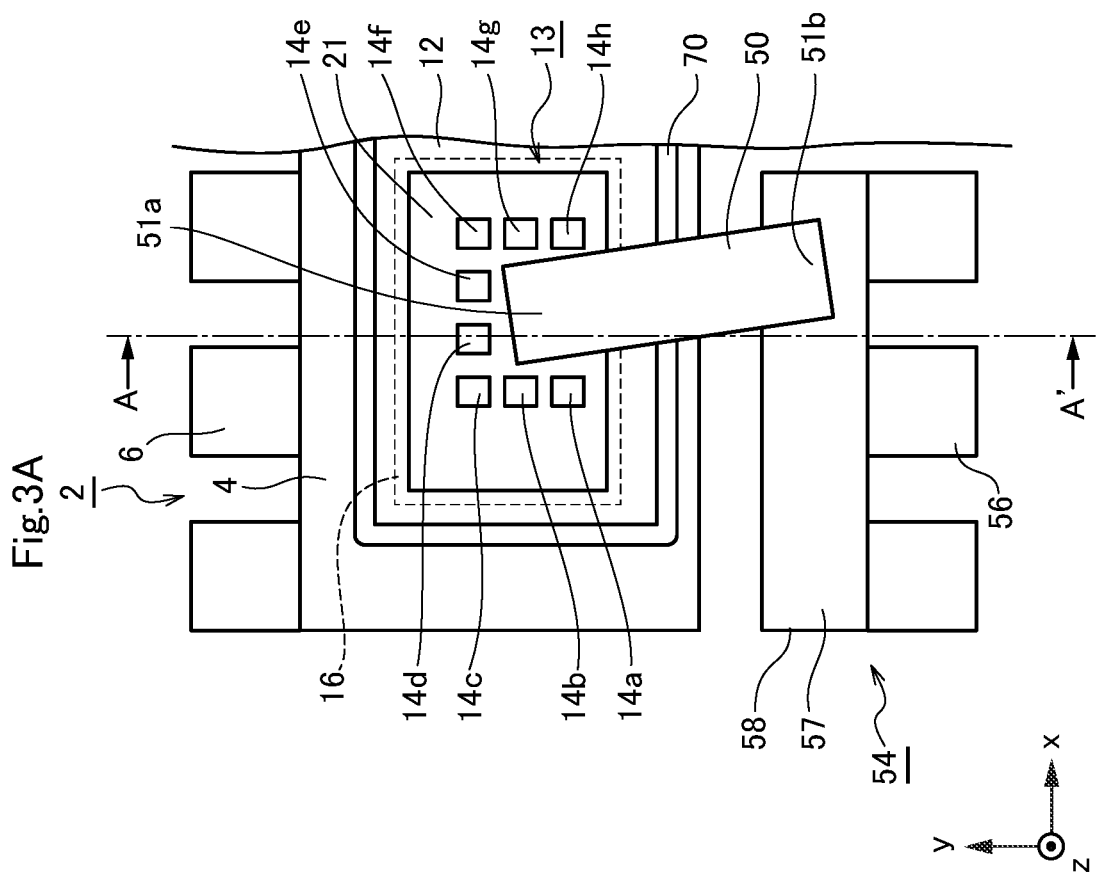
Figure 4B:
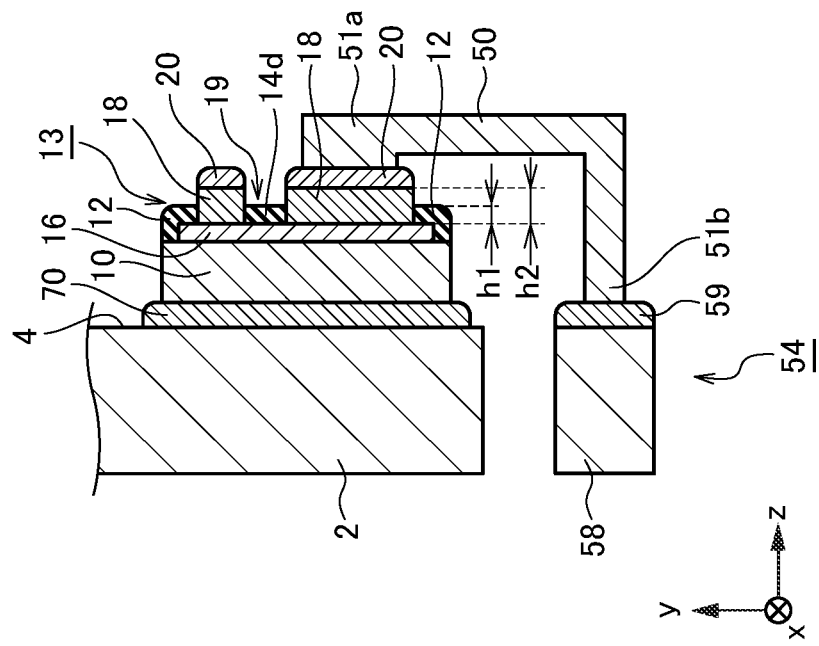
FIGS. 4A and 4B are schematic diagrams showing a part of the process of manufacturing the semiconductor device of the first embodiment.
Figure 4A:
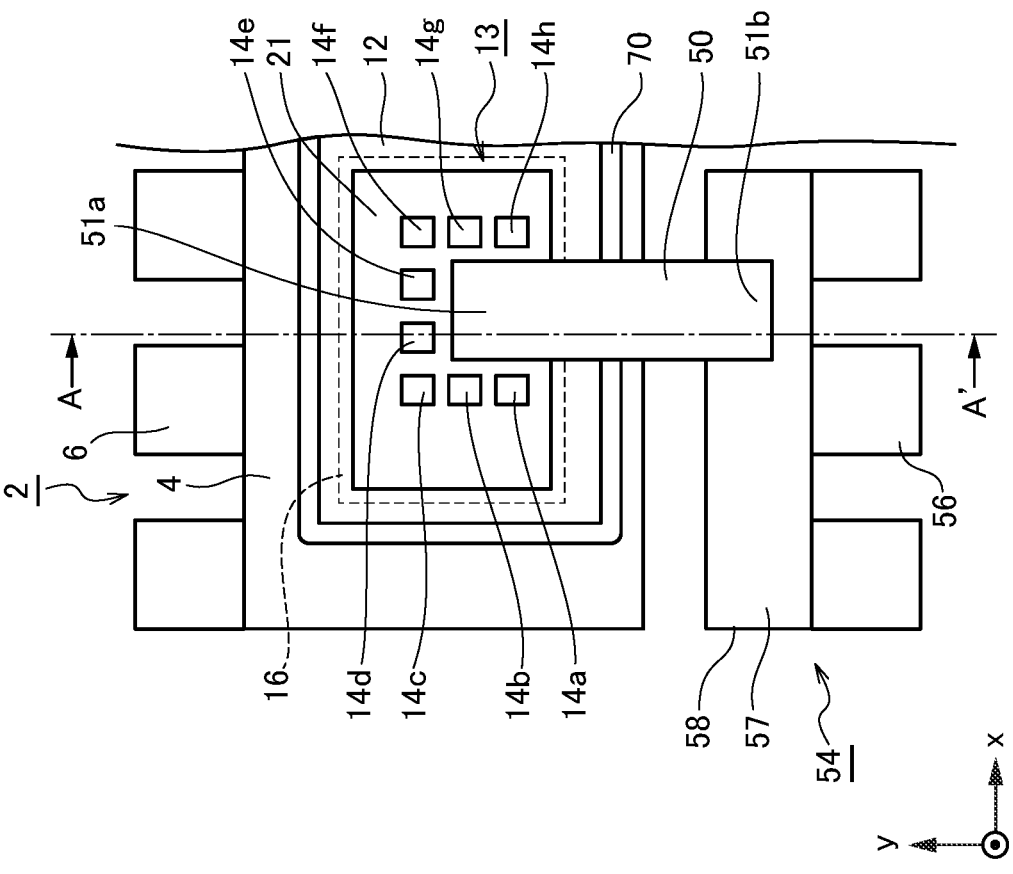

FIGS. 3A, 3B, 4A, and 4B are schematic diagrams showing a part of a process of manufacturing the semiconductor device 100 of embodiments. FIG. 3A is a schematic top view showing a part of the process of manufacturing the semiconductor device 100 of embodiments. FIG. 3B is a schematic cross-sectional view showing a part of the process of manufacturing the semiconductor device 100 in the AA' cross section of FIG. 3A. FIG. 4A is a schematic top view showing a part of the process of manufacturing the semiconductor device 100 of embodiments. FIG. 4B is a schematic cross-sectional view showing a part of the process of manufacturing the semiconductor device 100 in the AA' cross section of FIG. 4A.

Hereinafter, a part of the process of manufacturing the semiconductor device 100 of embodiments will be described with reference to FIGS. 3A, 3B, 4A, and 4B.

A method for manufacturing the semiconductor device of embodiments includes: placing the second solder paste 21 on the second metal film 18, the first metal film 16 being provided on the semiconductor chip 10, the first insulating film 12 being provided on the first metal film 16, the first insulating film 12 having the first opening 13 to which a part of the first metal film 16 being exposed, the second metal film 18 being provided in the first opening 13, the second metal film having a plurality of second openings 19, the second opening 19 being provided so as to surround a portion of the first metal film 16 to which the first end 51a of the first connector being to be connected, a plurality of second insulating films 14 being provided in direct contact with the first metal 16 in each of the plurality of second openings 19; placing the first end 51a of the first connector 50 so as to be in contact with the second solder paste 21; melting the second solder paste 21; and solidifying the second solder paste 21 by cooling to form the second solder 20.

First, a vertical MOSFET, an insulated gate bipolar transistor (IGBT), or the like is formed on a semiconductor substrate formed of silicon (Si), silicon carbide (SiC), gallium arsenide (GaAs), gallium nitride (GaN), or the like.

The first metal film 16 is formed on the semiconductor substrate by, for example, electroless plating. After patterning the formed first metal film 16, an insulating film containing, for example, polyimide is formed on the semiconductor substrate and the first metal film 16. By patterning the insulating film, the first insulating film 12 having the first opening 13 and a plurality of second insulating films 14 are formed. Here, the plurality of second insulating films 14 are formed so as to surround a portion to which the first end 51a of the first connector 50 is bonded later.

Then, the second metal film 18 is formed on the first metal film 16 in the first opening 13 by, for example, electroless plating. Then, the semiconductor substrate is diced to form the semiconductor chip 10.

Then, a first solder paste is placed on the top surface 4 of the die pad 2 by, for example, coating. Then, the semiconductor chip 10 is placed so as to be in contact with the first solder paste.

Then, the second solder paste 21 is placed on the second metal film 18 by, for example, coating. In addition, the third solder paste 57 is placed on the second bed portion 58 by, for example, coating. In addition, the fourth solder paste is placed on the gate electrode (not shown) of the semiconductor chip 10 by, for example, coating. In addition, the fifth solder paste is placed on the third bed portion 68 by, for example, coating.

Then, the first end 51a of the first connector 50 is placed so as to be in contact with the second solder paste 21. In addition, the second end 51b of the first connector is placed so as to be in contact with the third solder paste 57 (FIGS. 3A and 3B). In addition, the third end portion 61a of the second connector 60 is placed so as to be in contact with the solder paste on the gate electrode. In addition, the fourth end portion 61b of the second connector 60 is placed so as to be in contact with the solder paste on the third bed portion 68.

Then, the first solder paste, the second solder paste 21, and the third solder paste 57 are heated by reflow heat treatment to melt the first solder paste, the second solder paste 21, and the third solder paste 57. Then, the melted first solder paste, the melted second solder paste 21, and the melted third solder paste 57 are solidified by cooling. As a result, the first solder paste 70, the second solder 20 and the third solder 59 are formed. Similarly, the fourth solder 80 is formed between the gate electrode and the third end portion 61a. Similarly, the fifth solder 69 is formed between the third bed portion 68 and the fourth end portion 61b (FIGS. 4A and 4B).

Then, the function and effect of the semiconductor device of embodiments and the method for manufacturing the semiconductor device will be described.

Figure 5:
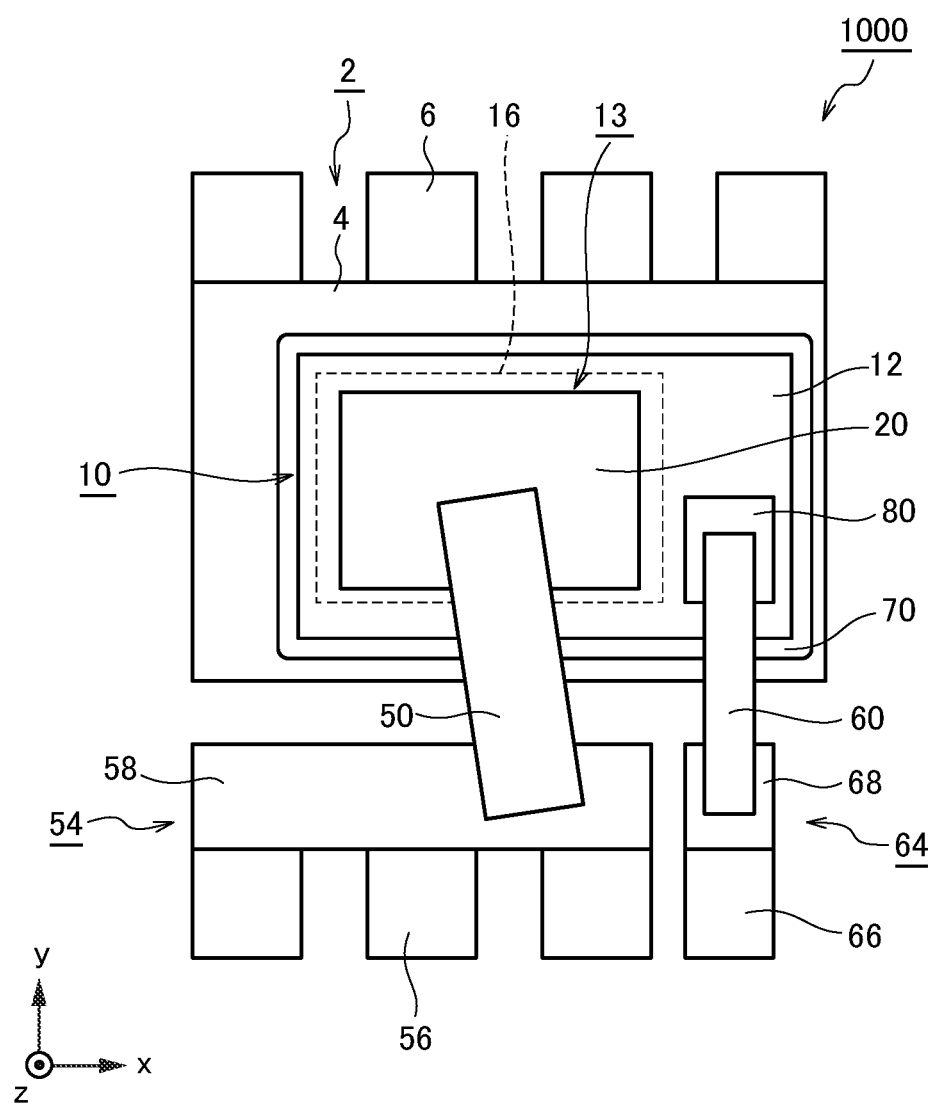
FIG. 5 is a schematic top view of a semiconductor device as a comparative form.

FIG. 5 is a schematic top view of a semiconductor device 1000 as a comparative form of embodiments. In the semiconductor device 1000, the plurality of second openings 19 and the plurality of second insulating films 14 are not provided.

In this case, since the area of the first opening 13 in the XY plane is much larger than the area of the first end 51a of the first connector 50 in the XY plane, the first connector 50 is easily fixed in a state deviated from the state parallel to the Y axis as shown in FIG. 5. Then, a distance between a part of the first metal film 16 and the first end 51a of the first connector 50 becomes longer. Since the distance becomes longer, an increase in thermal resistance and an increase in internal resistance occur between the portion of the first metal film 16 and the first end 51a.

On the other hand, when the size of the first metal film 16 in the XY plane is reduced in order to suppress the misalignment of the first connector 50, a distance between a part of the semiconductor chip 10 and the first end 51a of the first connector 50 becomes longer. As a result, an increase in internal resistance and an increase in thermal resistance occur between such part of the semiconductor chip 10 and the first end 51a of the first connector 50.

Therefore, the semiconductor device 100 of embodiments includes: the second metal film 18 provided in the first opening 13, the second metal film 18 having a plurality of second openings 19 provided so as to surround a portion of the first metal film 16 in contact with the first end 51a, and the second metal film 18 being provided between the first end 51a of the first connector 50 and the portion of the first metal film 16; and a plurality of second insulating films 14 provided in direct contact with the first metal film 16 in each of the plurality of second openings 19.

It is difficult to provide the second solder 20 on the plurality of second insulating films 14. This is because, in general, the contact angle of the solder with respect to the insulating film is large and accordingly, the wettability of the solder with respect to the insulating film is low. Therefore, the position where the first end 51a is connected by the second solder 20 is a position where the plurality of second insulating films 14 are not provided. As a result, the misalignment of the first connector 50 can be suppressed. Therefore, it is possible to provide a high-performance semiconductor device.

The height $h_2$ of the second metal film 18 in a direction perpendicular to the top surface 4 is preferably larger than the height $h_1$ of each of the plurality of second insulating films 14 in the direction perpendicular to the top surface 4. This is because, if the height $h_1$ of the second insulating film 14 is too large, the second insulating film 14 repels the second solder 20 in the vicinity of the second insulating film 14 even on the second metal film 18 to form a portion where the second solder 20 is not provided, and accordingly, the internal resistance and the thermal resistance tend to increase.

In addition, the height of the first insulating film 12 on the first metal film 16 in the direction perpendicular to the top surface 4 and the height of each of the plurality of second insulating films 14 on the first metal film 16 in the direction perpendicular to the top surface 4 are $h_1$ and are preferably equal to each other. This is to make it possible to easily form the first insulating film 12 and the plurality of second insulating films 14.

In addition, a case is considered in which one second insulating film that is not separated from each other is provided so as to surround a portion to which the first end 51a of the first connector 50 is connected. In this case, the second solder 20 connected to the first end 51a inside the second insulating film 14 and the second solder 20 outside the second insulating film 14 are separated from each other and are not in direct contact with each other. Therefore, the internal resistance and the thermal resistance increase, which is not preferable.

In the method for manufacturing the semiconductor device 1000 of embodiments, the second opening 19 of the second metal film 18 is provided in advance so as to surround a portion to which the first end 51a of the first connector 50 is connected. Then, the first solder paste 21 is placed on the second metal film 18. Then, the first end 51a of the first connector 50 is placed so as to be in contact with the first solder paste 21 on the portion to which the first end 51a of the first connector 50 is connected. Then, the first solder paste 21 is melted. Due to the surface tension of the melted first solder paste 21, the first end 51a of the first connector 50 is aligned at a position appropriately apart from the second insulating film 14. Thereafter, when the first solder paste 21 is solidified by cooling to form the second solder 20, the first end 51a of the first connector 50 is fixed in the above-described aligned state. As a result, it is possible to manufacture a high-performance semiconductor device in which the increase in thermal resistance and the increase in internal resistance are suppressed.

According to the semiconductor device of embodiments, it is possible to provide a high-performance semiconductor device.

Second Embodiment

A semiconductor device of embodiments is different from the semiconductor device of the first embodiment in that the shape of each of the plurality of second insulating films 14 in the plane parallel to the top surface 4 is square. Here, the description of the content overlapping the semiconductor device of the first embodiment will be omitted.

Figure 6:
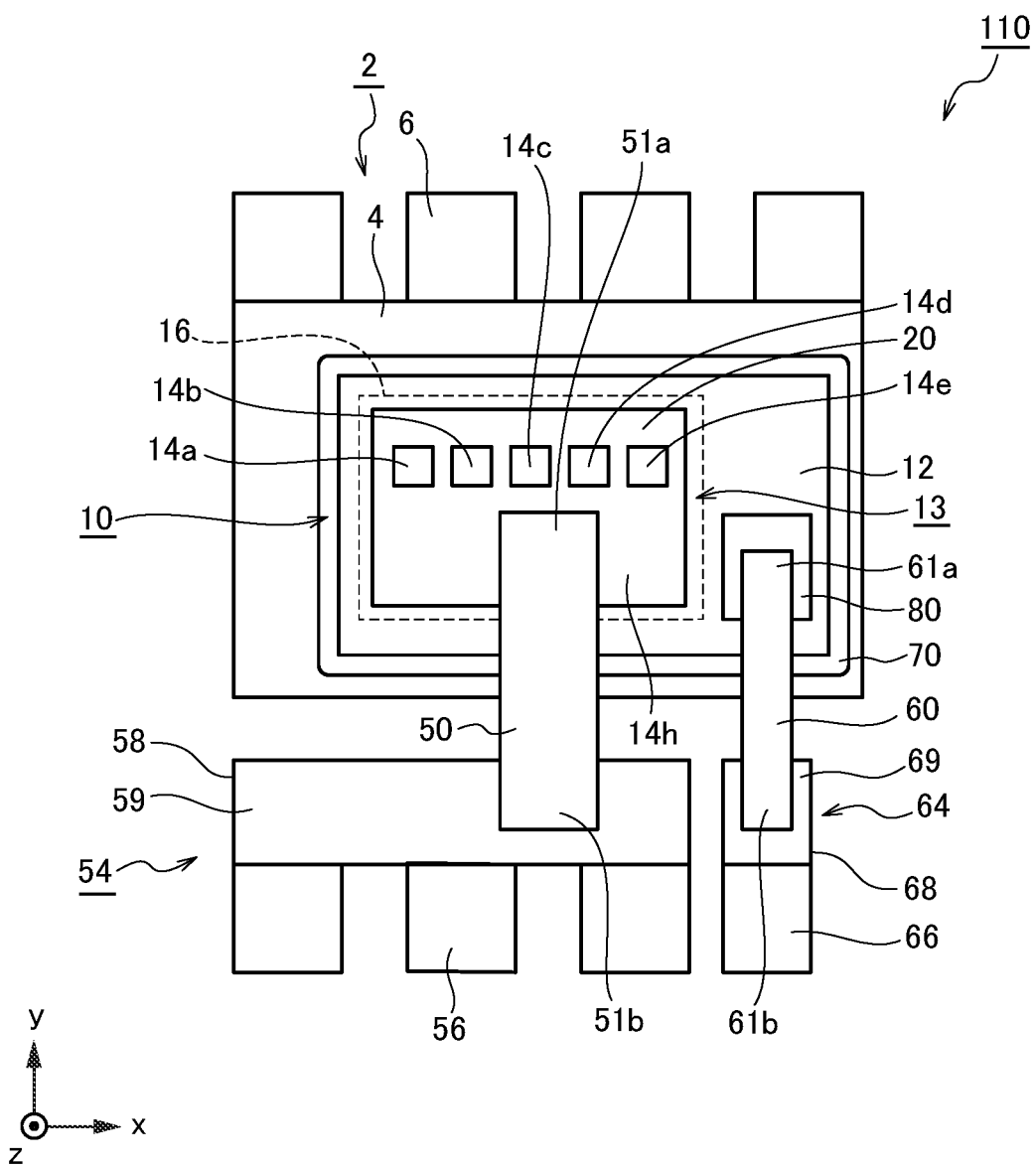
FIG. 6 is a schematic top view of a semiconductor device of a second embodiment.

FIG. 6 is a schematic top view of a semiconductor device 110 of embodiments. The second insulating films 14a, 14b, 14c, 14d, and 14e are provided side by side in the X direction. In addition, the number of second insulating films 14 or the arrangement of the second insulating films 14 are not limited to those shown in FIG. 6.

According to the semiconductor device of embodiments, it is also possible to provide a high-performance semiconductor device.

Third Embodiment

A semiconductor device of embodiments is different from the semiconductor device of the first embodiment in that the shape of each of the plurality of second insulating films 14 in the plane parallel to the top surface 4 is circular. Here, the description of the content overlapping the semiconductor device of the first embodiment will be omitted.

Figure 7:
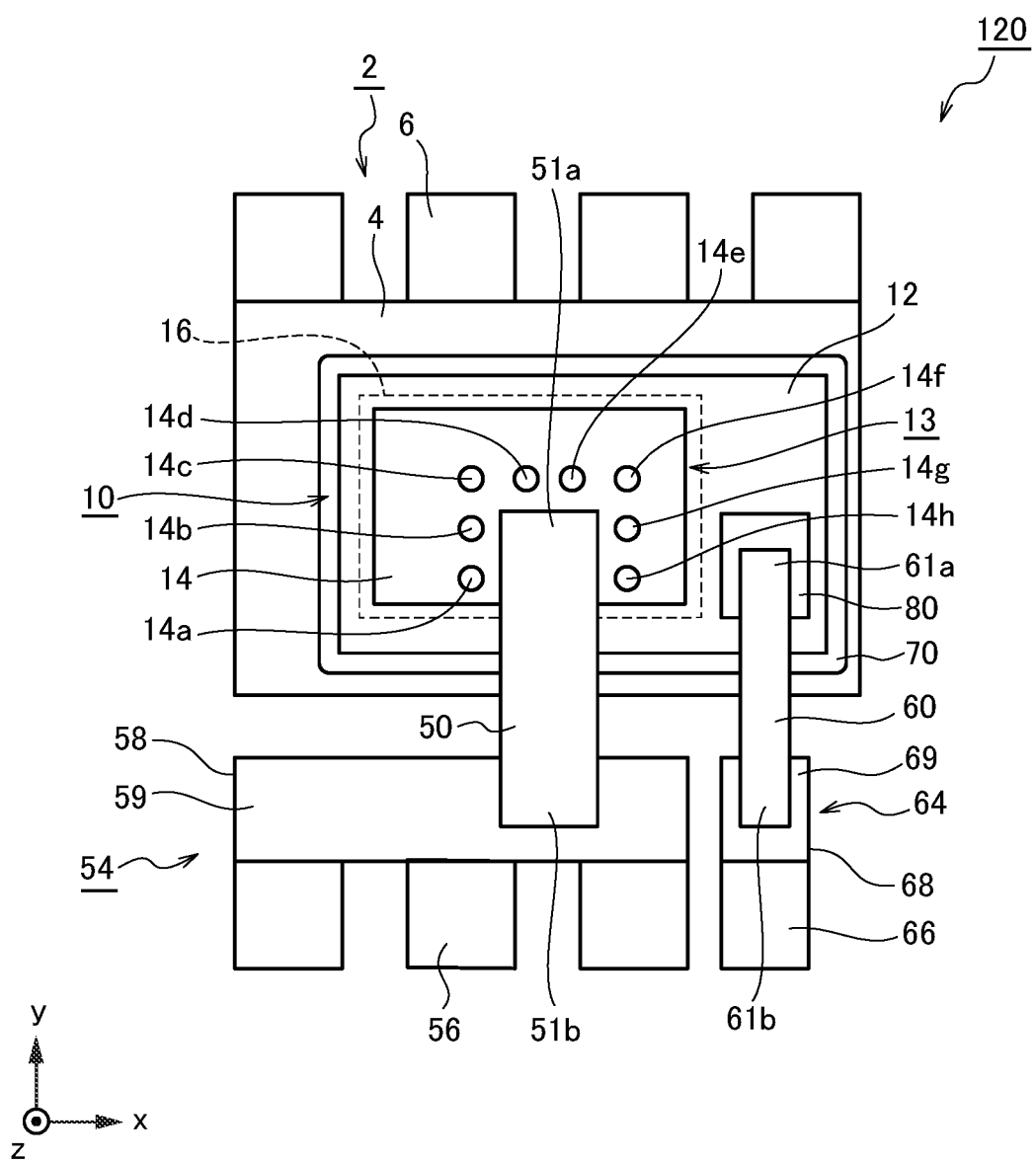
FIG. 7 is a schematic top view of a semiconductor device of a third embodiment.

FIG. 7 is a schematic top view of a semiconductor device 120 of embodiments. Second insulating films 14a, 14b, and 14c are provided side by side in the Y direction on the left side of the first connector 50 in FIG. 7. Second insulating films 14f, 14g, and 14h are provided side by side in the Y direction on the right side of the first connector 50 in FIG. 7. Second insulating films 14c, 14d, 14e, and 14f are provided side by side in the X direction. In addition, the number of second insulating films 14 or the arrangement of the second insulating films 14 are not limited to those shown in FIG. 7. For example, in FIG. 7, the shape of each of the plurality of second insulating films 14 in the plane parallel to the top surface 4 is a perfect circle. However, the shape of each of the plurality of second insulating films 14 in the plane parallel to the top surface 4 may be, for example, an elliptical shape.

According to the semiconductor device of embodiments, it is also possible to provide a high-performance semiconductor device.

Fourth Embodiment

A semiconductor device of embodiments is different from the semiconductor devices of the first to third embodiments in that, in the Y direction in which the first connector 50 extends so as to stretch between the die pad 2 and the first post portion 54 to which the second end 51b is connected, the second insulating film 14 provided so as to face the first connector 50 among the plurality of second insulating films 14 has a first rectangular shape that is longer in the Y direction than in the X direction in the plane parallel to the top surface 4 and, in the X direction crossing the Y direction in which the first connector 50 extends, the second insulating film 14 provided so as to face the first connector 50 among the plurality of second insulating films 14 has a second rectangular shape that is longer in the X direction than in the Y direction in the plane parallel to the top surface 4. Here, the description of the content overlapping the semiconductor devices of the first to third embodiments will be omitted.

Figure 8:
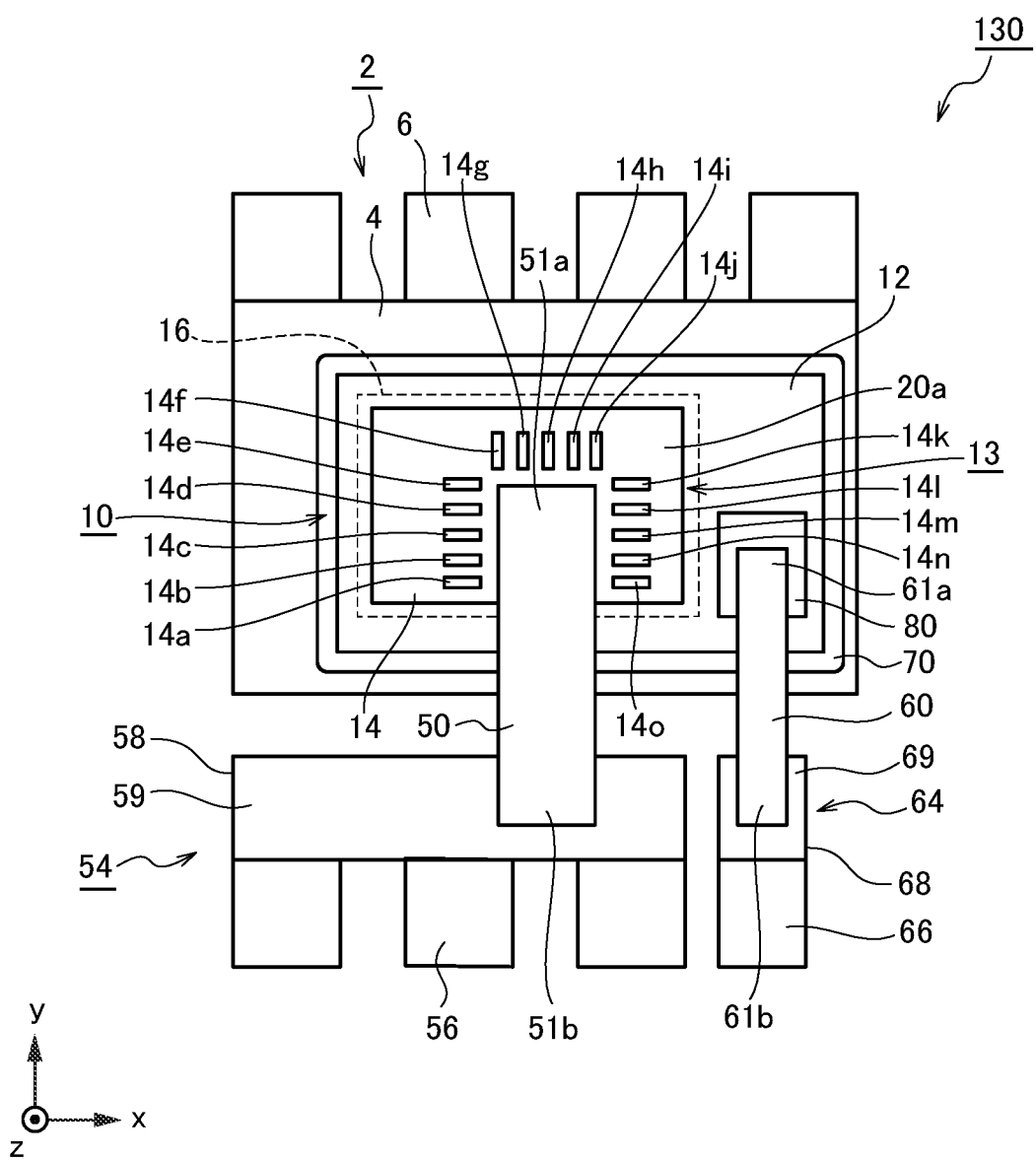
FIG. 8 is a schematic top view of a semiconductor device of a fourth embodiment.

FIG. 8 is a schematic top view of a semiconductor device 130 of embodiments. The shapes of the second insulating films 14f, 14g, 14h, 14i, and 14j provided so as to face the first connector 50 in the Y direction are rectangular shapes that are longer in the Y direction than in the X direction. The shapes of the second insulating films 14a, 14b, 14c, 14d, 14e, 14k, 14l, 14m, 14n, and 14o provided so as to face the first connector 50 in the X direction are rectangular shapes that are longer in the X direction than in the Y direction. In addition, the number of second insulating films 14 or the arrangement of the second insulating films 14 are not limited to those shown in FIG. 8.

According to the semiconductor device of embodiments, it is also possible to provide a high-performance semiconductor device.

Fifth Embodiment

A semiconductor device of embodiments is different from the semiconductor devices of the first to fourth embodiments in that, in the Y direction in which the first connector 50 extends so as to stretch between the die pad 2 and the first post portion 54 to which the second end 51b is connected, the second insulating film 14 provided so as to face the first connector 50 among the plurality of second insulating films 14 has a third rectangular shape that is longer in the X direction than in the Y direction in the plane parallel to the top surface 4 and, in the X direction crossing the Y direction in which the first connector 50 extends, the second insulating film 14 provided so as to face the first connector 50 has a fourth rectangular shape that is longer in the Y direction than in the X direction in the plane parallel to the top surface 4. Here, the description of the content overlapping the semiconductor devices of the first to fourth embodiments will be omitted.

Figure 9:
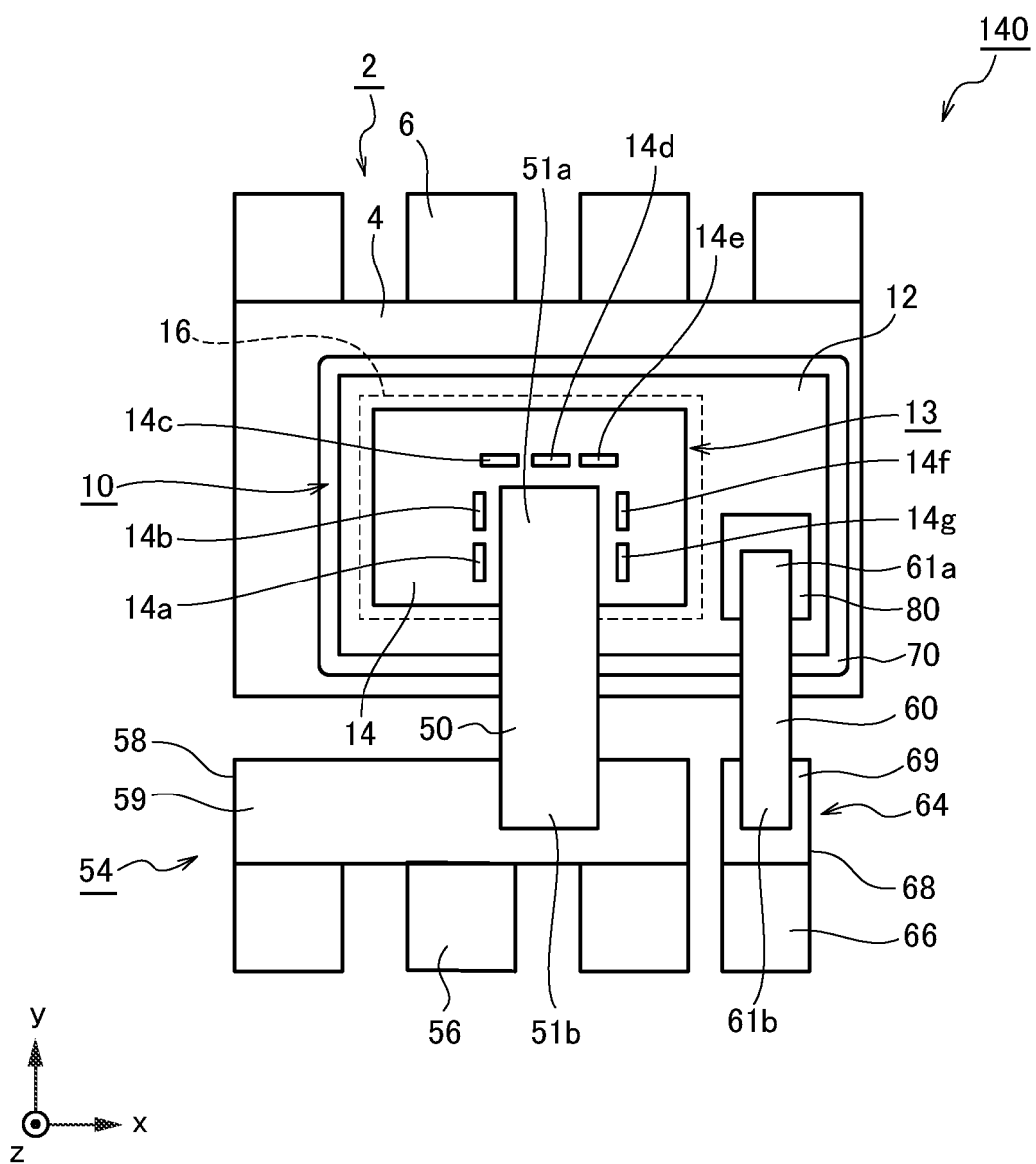
FIG. 9 is a schematic top view of a semiconductor device of a fifth embodiment.

FIG. 9 is a schematic top view of a semiconductor device 140 of embodiments. The shapes of the second insulating films 14c, 14d, and 14e provided so as to face the first connector 50 in the Y direction are rectangular shapes that are longer in the X direction than in the Y direction. The shapes of the second insulating films 14a, 14b, 14f, and 14g provided so as to face the first connector 50 in the X direction are rectangular shapes that are longer in the Y direction than in the X direction. In addition, the number of second insulating films 14 or the arrangement of the second insulating films 14 are not limited to those shown in FIG. 9.

According to the semiconductor device of embodiments, it is also possible to provide a high-performance semiconductor device.

Sixth Embodiment

Figure 10:
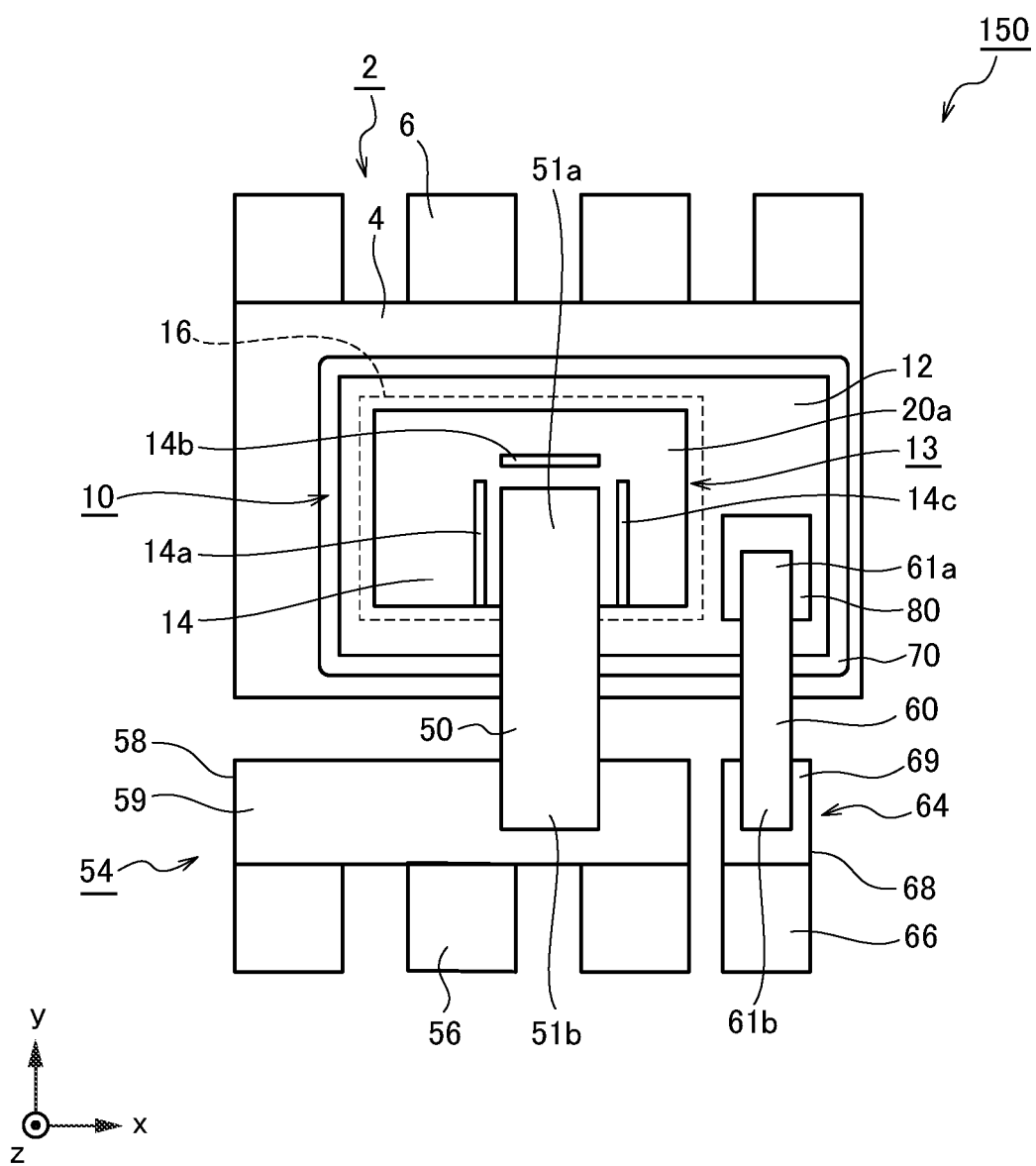
FIG. 10 is a schematic top view of a semiconductor device of a sixth embodiment.

FIG. 10 is a schematic top view of a semiconductor device 150 of embodiments.

The shape of the second insulating film 14b provided so as to face the first connector 50 in the Y direction is a rectangular shape that is longer in the X direction than in the Y direction. The shapes of the second insulating films 14a and 14c provided so as to face the first connector 50 in the X direction are rectangular shapes that are longer in the Y direction than in the X direction. In these respects, the semiconductor device 150 of embodiments is similar to the semiconductor device 140 shown in FIG. 9. However, the difference is that, in the semiconductor device 140, the two second insulating films 14a and 14b are provided adjacent to the first connector 50 on the left side (−X direction) of the first connector 50, whereas in the semiconductor device 150, one second insulating film 14a is provided. In addition, the difference is that, in the semiconductor device 140, the three second insulating films 14c, 14d, and 14e are provided adjacent to the first connector 50 on the upper side (Y direction) of the first connector 50, whereas in the semiconductor device 150, one second insulating film 14b is provided. In addition, the difference is that, in the semiconductor device 140, the two second insulating films 14f and 14g are provided adjacent to the first connector 50 on the right side (X direction) of the first connector 50, whereas in the semiconductor device 150, one second insulating film 14c is provided.

According to the semiconductor device of embodiments, it is also possible to provide a high-performance semiconductor device.

Seventh Embodiment

A semiconductor device of embodiments is different from the semiconductor devices of the second to sixth embodiments in that, when the length of the semiconductor chip 10 in the Y direction in which the first connector 50 extends is $L_1$ and the length of the semiconductor chip 10 in the X direction is $L_2$, the second insulating film 14 is not provided in a range of $(L_1/10)$ in the Y direction on the inner side of the first opening 13 from the corner of the first opening 13 and a range of $(L_2/10)$ in the X direction on the inner side of the first opening 13 from the corner of the first opening 13. Here, the description of the content overlapping the content of the first to sixth embodiments will be omitted.

Figure 11:
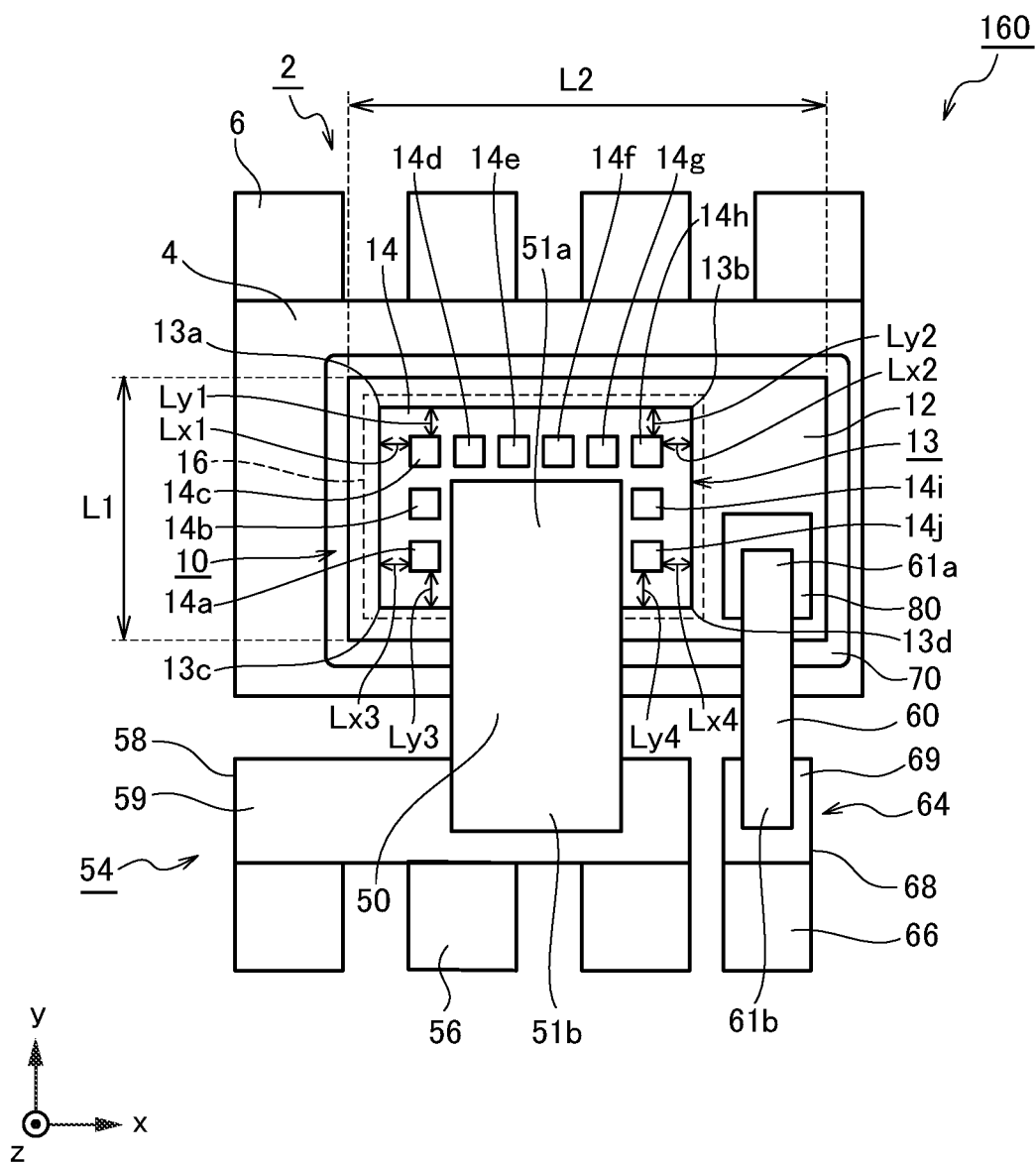
FIG. 11 is a schematic top view of a semiconductor device of a seventh embodiment.

FIG. 11 is a schematic top view of a semiconductor device 160 of embodiments.

The second insulating film 14 is not provided in a range of $L_{X1}$ in the X direction from a corner 13a of the first opening, a range of $L_{X2}$ in the −X direction from a corner 13b of the first opening, a range of $L_{X3}$ in the X direction from a corner 13c of the first opening, and a range of $L_{X4}$ in the −X direction from a corner 13d of the first opening. In addition, $L_{X1} \geq (L_2/10)$, $L_{X2} \geq (L_2/10)$, $L_{X3} \geq (L_2/10)$, and $L_{X4} \geq (L_2/10)$. In addition, the second insulating film 14 is not provided in a range of $L_{Y1}$ in the −Y direction from the corner 13a of the first opening, a range of $L_{Y2}$ in the −Y direction from the corner 13b of the first opening, a range of $L_{Y3}$ in the Y direction from the corner 13c of the first opening, and a range of $L_{Y4}$ in the Y direction from the corner 13d of the first opening. In addition, $L_{Y1} \geq (L_1/10)$, $L_{Y2} \geq (L_1/10)$, $L_{Y3} \geq (L_1/10)$, and $L_{Y4} \geq (L_1/10)$. This is because the position of the first connector 50 is preferably a position apart from the corner of the first opening 13 in order to suppress an increase in thermal resistance and an increase in internal resistance.

According to the semiconductor device of embodiments, it is also possible to provide a high-performance semiconductor device.

Eighth Embodiment

A semiconductor device of embodiments is different from the semiconductor devices of the first to seventh embodiments in that a plurality of first openings 13 are provided and the second insulating film 14 is provided at the corner of the first opening 13. Here, the description of the content overlapping the semiconductor devices of the first to seventh embodiments will be omitted.

Figure 12:
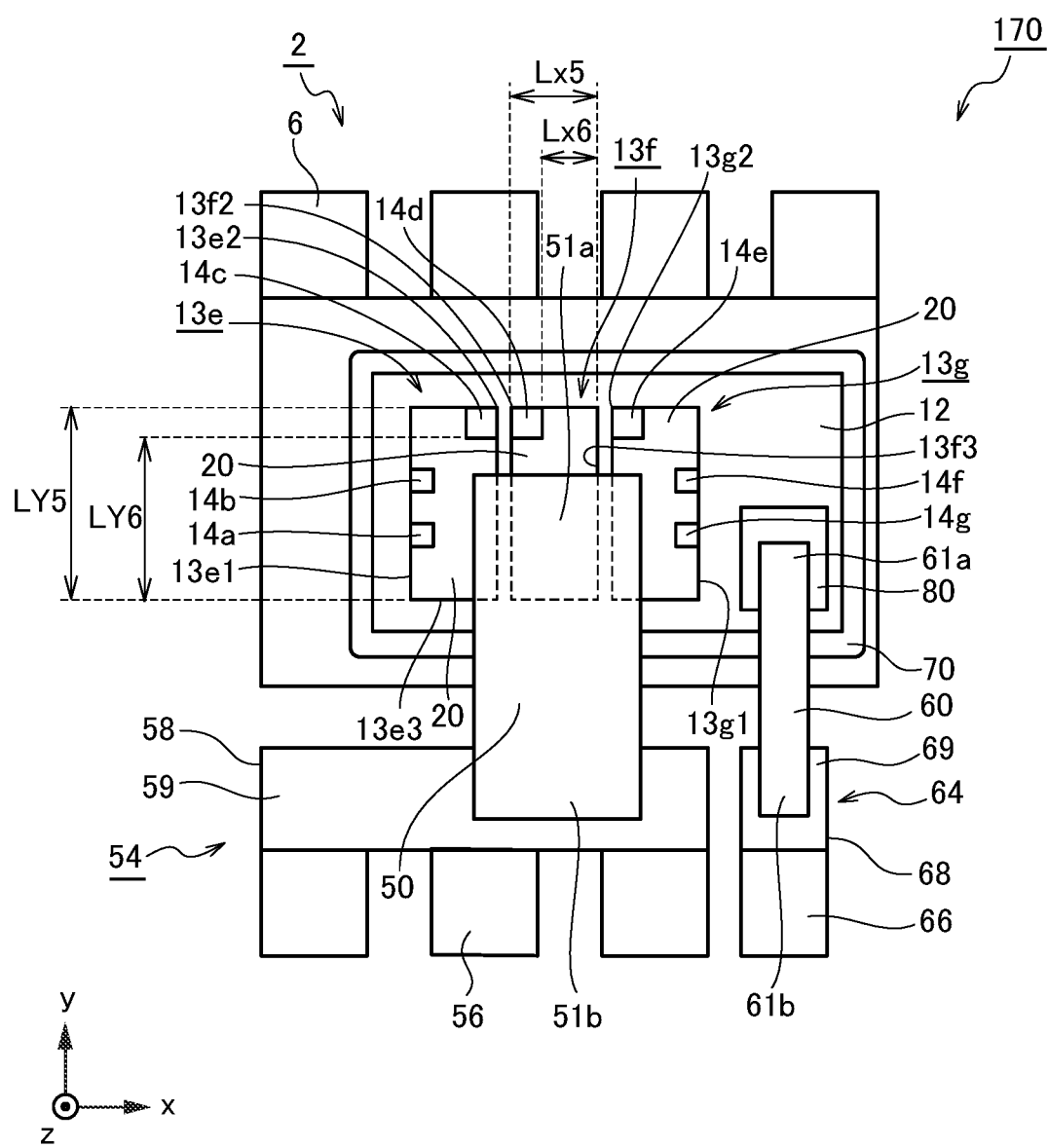
FIG. 12 is a schematic top view of a semiconductor device of an eighth embodiment.

FIG. 12 is a schematic top view of a semiconductor device 170 of embodiments. A first opening 13e, a first opening 13f, and a first opening 13g are provided. Second insulating films 14a and 14b are provided on the edge $13e_1$ of the first opening 13e. Second insulating films 14f and 14g are provided on the edge $13g_1$ of the first opening 13g. When a plurality of first openings 13 are provided, the area of each first opening 13 may be too small. In this case, since the wettability of the second solder 20 around the second insulating film 14 is low, the thermal resistance and the internal resistance may increase. Therefore, it is preferable to provide the second insulating film 14 on the edge of the first opening 13.

In addition, a second insulating film 14c is provided at the corner $13e_2$ of the first opening 13e. A second insulating film 14d is provided at the corner $13f_2$ of the first opening 13f. A second insulating film 14e is provided at the corner $13g_2$ of the first opening 13g. When a plurality of first openings 13 are provided, the area of each first opening 13 may be too small. In this case, since the wettability of the second solder 20 around the second insulating film 14 is low, the thermal resistance and the internal resistance may increase. Therefore, it is preferable to provide the second insulating film 14 at the corner of the first opening 13.

The distance between the second insulating film 14d and the edge $13f_3$ of the first opening 13f facing the second insulating film 14d in the X direction is assumed to be $L_{X6}$. In addition, the length of the first opening 13f in the X direction is assumed to be $L_{Y5}$. At this time, it is preferable that $L_{X6} \geq (\frac{1}{2}) L_{X5}$. When $L_{X6} < (\frac{1}{2}) L_{X5}$, the distance $L_{X6}$ is too short, so that the second solder 20 on the side of the second insulating film 14d in the X direction may not be sufficiently formed. For this reason, an increase in thermal resistance and an increase in internal resistance may occur in a portion on the side of the second insulating film 14d in the X direction. Therefore, it is preferable that $L_{X6} (\frac{1}{2})L_{X5}$.

The distance between the second insulating film 14c and the edge $13e_3$ of the first opening 13e facing the second insulating film 14c in the −Y direction is assumed to be $L_{Y6}$. The length of the first opening 13e in the Y direction is assumed to be $L_{Y5}$. At this time, it is preferable that $L_{Y6} \geq (\frac{1}{2})L_{Y5}$. When $L_{Y6} < (\frac{1}{2})L_{Y5}$, the distance $L_{Y6}$ is too short, so that the second solder 20 on the side of the second insulating film 14c in the −Y direction may not be sufficiently formed. For this reason, an increase in thermal resistance and an increase in internal resistance may occur in a portion on the side of the second insulating film 14c in the −Y direction. Therefore, it is preferable that $L_{Y6} \geq (\frac{1}{2})L_{Y5}$.

In addition, for example, when collectively forming wires such as gate wires of a MOSFET, these may be formed below a region between the first openings 13.

According to the semiconductor device of embodiments, it is also possible to provide a high-performance semiconductor device.

Ninth Embodiment

A semiconductor device of embodiments is different from the semiconductor devices of the fifth and sixth embodiments in that a first side provided on a side facing a first connector having a rectangular shape is longer than a second side facing the first side having a rectangular shape. Here, the description of the content overlapping the first to eighth embodiments will be omitted.

Figure 13:
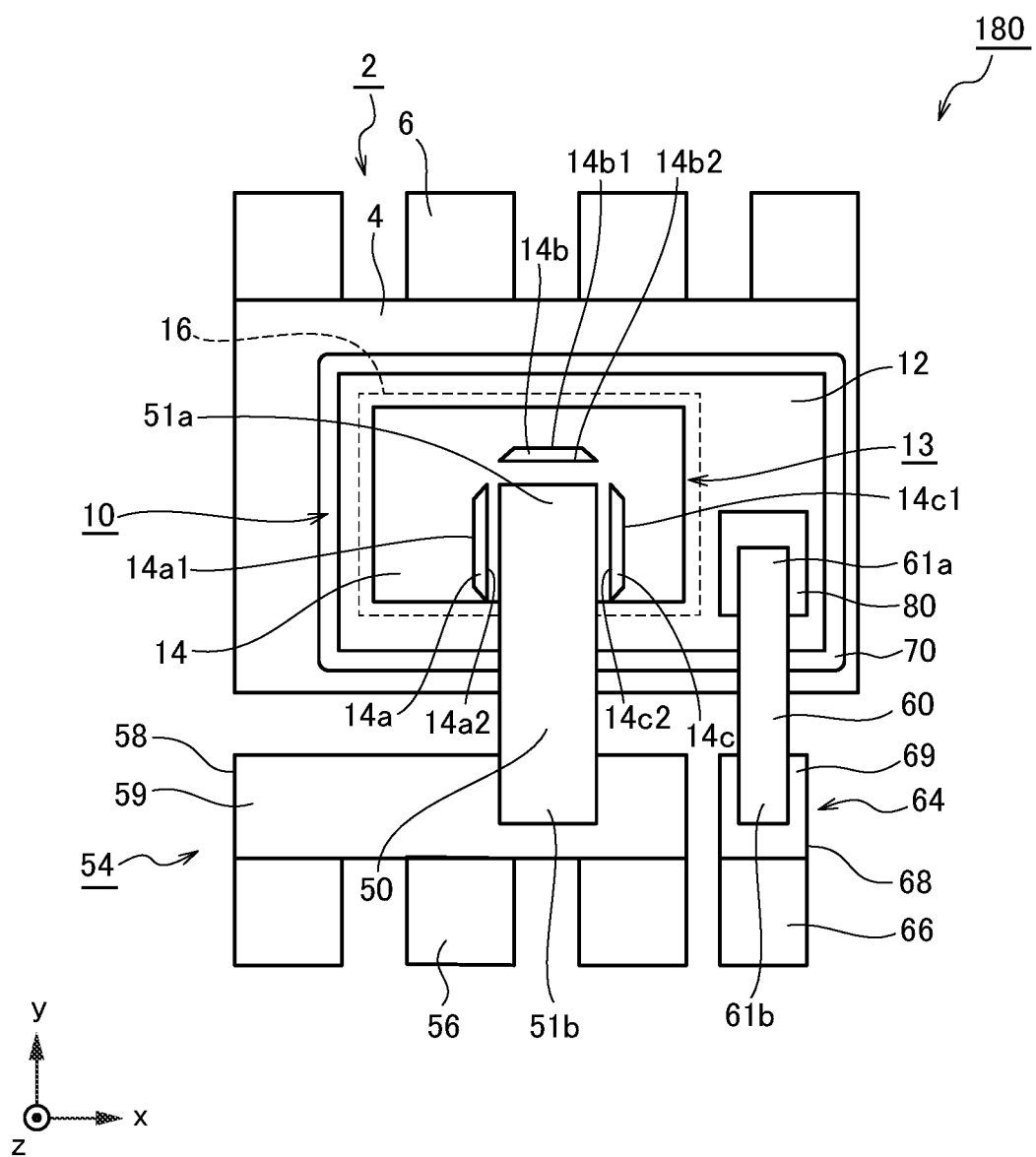
FIG. 13 is a schematic top view of a semiconductor device of a ninth embodiment.

FIG. 13 is a schematic top view of a semiconductor device 180 of embodiments.

In the semiconductor device 180, a second insulating film 14a is provided adjacent to the first connector 50 on the left side (−X direction) of the first connector 50. In addition, a second insulating film 14b is provided adjacent to the first connector 50 on the upper side (Y direction) of the first connector 50. In addition, a second insulating film 14c is provided adjacent to the first connector 50 on the right side (X direction) of the first connector 50. In addition, the shapes of the second insulating films 14a, 14b, and 14c are all trapezoidal. In addition, a side $14a_2$ of the second insulating film 14a provided on a side facing the first connector 50 is longer than a side $14a_1$ facing the side $14a_2$. In addition, a side 14b2 of the second insulating film 14b provided on a side facing the first connector 50 is longer than a side $14b_1$ facing the side $14b_2$. In addition, a side $14c_2$ of the second insulating film 14c provided on a side facing the first connector 50 is longer than a side $14c_1$ facing the side 14c2.

The area of the second insulating film 14 in a plane parallel to the top surface 4 is preferably as small as possible. This is because, if the area of the second insulating film 14 increases, the second solder 20 is not provided in a portion where the second insulating film 14 is provided, and accordingly, the thermal resistance and the internal resistance of the semiconductor device can increase. Therefore, by shortening the lengths of the sides $14a_1$, $14b_1$, and $14c_1$ to reduce the area of the second insulating film 14, an increase in thermal resistance and an increase in internal resistance in the semiconductor device are suppressed. On the other hand, the lengths of the sides $14a_2$, $14b_2$, and $14c_2$ are increased so that the misalignment of the first connector 50 is less likely to occur.

According to the semiconductor device of embodiments, it is also possible to provide a high-performance semiconductor device.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a die pad having a top surface;
   a semiconductor chip provided on the top surface;
   a first solder provided between the top surface and the semiconductor chip, the first solder bonding the top surface and the semiconductor chip;
   a first metal film provided on the semiconductor chip;
   a first insulating film provided on the first metal film and having a first opening;
   a connector having a first end and a second end, the first end being provided on the first metal film in the first opening;
   a second metal film provided in the first opening, the second metal film having a plurality of second openings provided so as to surround a portion of the first metal film in contact with the first end, and the second metal film being provided between the first end of the connector and the portion of the first metal film;
   a plurality of second insulating films provided in direct contact with the first metal film in each of the second openings; and
   a second solder provided between the second metal film and the first end to bond the first end and the second metal film to each other.

2. The semiconductor device according to claim 1, wherein a height of the second metal film in a direction perpendicular to the top surface is larger than a height of the second insulating film in the direction perpendicular to the top surface.

3. The semiconductor device according to claim 1, wherein a height of the first insulating film in a direction perpendicular to the top surface is equal to a height of the second insulating film in the direction perpendicular to the top surface.

4. The semiconductor device according to claim 1, wherein each of the second insulating films in a plane parallel to the top surface has a square shape.

5. The semiconductor device according to claim 1, wherein each of the second insulating films in a plane parallel to the top surface has a circular shape.

6. The semiconductor device according to claim 1, wherein, in a first direction in which the connector extends so as to stretch between the die pad and a post portion to which the second end is connected, the second insulating film provided so as to face the connector among the second insulating films has a first rectangular shape longer in the first direction than in a second direction crossing the first direction in a plane parallel to the top surface, and in the second direction, the second insulating film provided so as to face the connector among the second insulating films has a second rectangular shape longer in the second direction than in the first direction in the plane parallel to the top surface.

7. The semiconductor device according to claim 1,
wherein, in a first direction in which the connector extends so as to stretch between the die pad and a post portion to which the second end is connected, the second insulating film provided so as to face the connector among the second insulating films has a third rectangular shape longer in a second direction crossing a first direction than in the first direction in a plane parallel to the top surface, and
in the second direction, the second insulating film provided so as to face the connector among the second insulating films has a fourth rectangular shape longer in the first direction than in the second direction in the plane parallel to the top surface.

8. The semiconductor device according to claim 1,
wherein, when a length of the semiconductor chip in a first direction in which the connector extends so as to stretch between the die pad and a post portion to which the second end is connected is $L_1$ and a length of the semiconductor chip in a second direction crossing the first direction is $L_2$, the second insulating film is not provided in a range of $(L_1/10)$ in the first direction on an inner side of the first opening from a corner of the first opening and a range of $(L_2/10)$ in the second direction on the inner side of the first opening from the corner of the first opening.

9. The semiconductor device according to claim 1,
wherein the first insulating film has a plurality of the first openings, and
the second insulating film is provided at a corner of the first opening.

10. The semiconductor device according to claim 1,
wherein the first metal film contains aluminum (Al).

11. The semiconductor device according to claim 1,
wherein the second metal film contains nickel (Ni) and gold (Au).

12. The semiconductor device according to claim 7,
wherein a first side of the third rectangular shape provided on a side facing the first connector is longer than a second side facing the first side, and
a third side of the fourth rectangular shape provided on a side facing the first connector is longer than a fourth side facing the third side.

* * * * *